(12) United States Patent
Neoh et al.

(10) Patent No.: US 10,832,997 B2
(45) Date of Patent: Nov. 10, 2020

(54) LEAD-FRAME STRUCTURE, LEAD-FRAME, SURFACE MOUNT ELECTRONIC DEVICE AND METHODS OF PRODUCING SAME

(71) Applicant: Atotech Deutschland GmbH, Berlin (DE)

(72) Inventors: Din-Ghee Neoh, Berlin (DE); Jürgen Barthelmes, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 261 days.

(21) Appl. No.: 16/083,525

(22) PCT Filed: Mar. 10, 2017

(86) PCT No.: PCT/EP2017/055726
§ 371 (c)(1),
(2) Date: Sep. 10, 2018

(87) PCT Pub. No.: WO2017/153590
PCT Pub. Date: Sep. 14, 2017

(65) Prior Publication Data
US 2019/0080930 A1    Mar. 14, 2019

(30) Foreign Application Priority Data
Mar. 11, 2016  (EP) .................................. 16159880

(51) Int. Cl.
*H01L 23/495*  (2006.01)
*C25D 3/46*  (2006.01)
(Continued)

(52) U.S. Cl.
CPC .... *H01L 23/49582* (2013.01); *C23C 18/1603* (2013.01); *C23C 18/1689* (2013.01);
(Continued)

(58) Field of Classification Search
CPC ...................................................... H01L 23/495
See application file for complete search history.

(56) References Cited

U.S. PATENT DOCUMENTS

| | | |
|---|---|---|
| 4,968,397 A | 11/1990 | Asher et al. |
| 5,300,158 A | 4/1994 | Chen et al. |

(Continued)

FOREIGN PATENT DOCUMENTS

| | | |
|---|---|---|
| JP | 09181241 | 7/1997 |
| JP | 11274177 | 10/1999 |

OTHER PUBLICATIONS

Cui et al.: "Adhesion Enhancement of Pd Plated Leadframes", Electronic Components and Technology Conference, 1999, pp. 837-841.
(Continued)

*Primary Examiner* — Marvin Payen
(74) *Attorney, Agent, or Firm* — Renner, Otto, Boisselle & Sklar, LLP

(57) ABSTRACT

A method of producing a lead-frame structure having two faces and exposing a treated silver surface on at least one of the two faces, the treated silver surface(s) serving the wire bonding, which yields a surface which, after applying resin to it, has excellent adhesion even under severe testing conditions, such as the IPC/JEDEC J-STD-20 MSL standard, and a method of producing a surface mount electronic device including a lead-frame or lead-frame entity and at least one semiconductor device mounted thereon, wherein the lead-frame or lead-frame entity exposes a treated silver surface on at least one of the two faces, wherein the treated silver surface(s) serve(s) the wire bonding, and wherein a resin is applied to the lead-frame or lead-frame entity, which
(Continued)

method yields excellent adhesion of the surface of the lead-frame or lead-frame entity even under severe testing conditions.

10 Claims, 6 Drawing Sheets

(51) Int. Cl.
*C25D 5/02* (2006.01)
*C25D 5/48* (2006.01)
*C23C 18/16* (2006.01)
*C23C 18/42* (2006.01)
*H01L 23/31* (2006.01)
*C25D 5/34* (2006.01)
*C23C 18/54* (2006.01)
*H01L 21/48* (2006.01)
*H01L 23/14* (2006.01)
*C23C 18/18* (2006.01)
*H01L 23/00* (2006.01)

(52) U.S. Cl.
CPC .............. *C23C 18/42* (2013.01); *C23C 18/54* (2013.01); *C25D 3/46* (2013.01); *C25D 5/02* (2013.01); *C25D 5/34* (2013.01); *C25D 5/48* (2013.01); *H01L 21/4821* (2013.01); *H01L 23/14* (2013.01); *H01L 23/3142* (2013.01); *H01L 23/49541* (2013.01); *H01L 23/49575* (2013.01); *C23C 18/1614* (2013.01); *C23C 18/1893* (2013.01); *H01L 23/564* (2013.01)

(56) References Cited

U.S. PATENT DOCUMENTS

| | | | |
|---|---|---|---|
| 5,343,073 | A | 8/1994 | Parthasarathi et al. |
| 5,449,951 | A | 9/1995 | Parthasarathi et al. |
| 6,852,427 | B1 | 2/2005 | Howell et al. |
| 2005/0121330 | A1 | 6/2005 | Howell et al. |
| 2008/0216921 | A1 | 9/2008 | Kwan et al. |
| 2010/0288731 | A1 | 11/2010 | Wunderlich et al. |
| 2012/0020047 | A1 | 1/2012 | Wunderlich et al. |

OTHER PUBLICATIONS

PCT/EP2017/055726; PCT International Search Report and Written Opinion of the International Searching Authority dated Jun. 6, 2017.

LEAD-FRAME STRUCTURE, LEAD-FRAME, SURFACE MOUNT ELECTRONIC DEVICE AND METHODS OF PRODUCING SAME

The present application is a U.S. National Stage Application based on and claiming benefit and priority under 35 U.S.C. § 371 of International Application No. PCT/EP2017/055726, filed 10 Mar. 2017, which in turn claims benefit of and priority to European Application No. 16159880.0 filed 11 Mar. 2016, the entirety of both of which is hereby incorporated herein by reference.

FIELD OF THE INVENTION

The present invention relates to lead-frames structures used in the production of surface mount electronic devices, to lead-frames, surface mount electronic devices, as well as to methods of producing lead-frames structures, lead-frames, and surface mount electronic devices.

BACKGROUND OF THE INVENTION

Lead-frame structures (multiple panels of lead-frame entities) are used in the production of surface mount electronic devices (SMDs) which are assembled on printed circuit boards. One step in the production of SMDs is the application of a resin material (mold) on top of the lead-frame structure for protection purposes, i.e., the formation of packages. A lead-frame body structure (multiple panel of lead-frame body entities) is generally made of copper or a copper alloy (copper/tin, copper/iron/phosphorus, or copper/chromium/tin/zinc alloys, for example). Lead-frame entities very often expose copper and silver surfaces. Thus, the mold is in contact with copper and silver surfaces present on the lead-frame entity. During SMD product life time it must be guaranteed that there will occur no delamination between the metal and the mold, otherwise the SMD may fail.

During the lifetime of the package, ambient moisture may be absorbed at the interface between the mold and the lead-frame entity. Moisture absorption and the retention thereof inside the package results in trapping of the moisture therein which is then vaporized, when the package is subjected to a sudden temperature rise, such as during soldering of the package when it is mounted to the printed circuit board. Consequently, the vaporizing moisture exerts tremendous internal package stress, which may lead to delamination in the mold/lead-frame entity interface. To avoid delamination the package must be stored before assembly under moisture-free conditions to avoid absorption of moisture prior to soldering. This approach however, raises production cost and renders quality control more difficult. Due to the particularly high soldering temperature used when lead-free solder is employed, delamination is more likely to occur, resulting in package failure to an even greater extent.

In order to recognize the tendency of a given package with respect to delamination, IPC/JEDEC defined a standard classification of moisture sensitivity levels (MSLs) of leaded IC packages. According to this standard (J-STD-20 MSL), MSLs are expressed in terms of numbers, wherein the MSL number increases with the vulnerability of the package to delamination. Thus, MSL1 corresponds to packages that are immune to delamination regardless of the exposure to moisture while MSL5 and MSL6 devices are most prone to moisture-induced fracture. In order to ensure sufficient adhesion under practical conditions, leaded IC packages are tested according to the IPC/JEDEC J-STD-20 MSL standard. Another practical test for adhesion strength is the Tab Pull Test which is common in the industry for qualification purposes. An indication of the adhesion strength between a metal surface and the mold may also be obtained from a simple peeling test. Both, the Tab Pull Test and the peeling test are used during the development and qualification phase as a good tool to identify improvements in adhesion between a metal surface and a resin material. The tab pull test and the peeling test are typically performed on a test specimen rather than on a real package. For the MSL test on real packages, C-mode scanning acoustic microscopy (C-SAM) is commonly used to detect delamination at the interface between silver and the mold.

Typically, the surface of most lead-frames structures currently produced consist of two metals, namely copper or a copper alloy from which the lead-frame body structure is made, and silver which is present on the surface of the lead-frame body structure. The relative area proportions of copper and silver will vary between different lead-frame structures. The base material influences the thermal and mechanical stability of the lead-frame structure. Silver at the lead-frame structure surface is required to create an electrically conducting connection between the lead-frame structure and the semiconductor devices mounted thereon. This electrical connection is usually created with thermosonic bonding (TSB), which involves the contacting of a thin wire to both, the semiconductor device and the silver, on the lead-frame structure.

TSB, which will also be referred herein after to as wire bonding, is a surface-welding process in which two clean metal surfaces (of the substrate and the wire) are brought into contact so as to create a stable bond between the bonding wire (which usually consists of gold or copper or modifications thereof and the silver on the lead-frame structure substrate. Thus, this process is sensitive to impurities on the metal surfaces.

As far as copper and copper alloy surfaces of lead-frames structures are concerned, it is now common in lead-frame structure production to roughen the copper or copper alloy surface in order to improve the adhesion between that surface and the mold subsequently applied to the lead-frame structure in the production of SMDs. The roughening is usually achieved by a chemical etching process, but may also be achieved by electrochemically treating the copper surface, i.e., by applying an anodic current to the copper material. Some of the chemical etching processes also produce an oxide layer on the copper surfaces, which has a positive effect on adhesion, because the metal oxide surfaces generally show better adhesion to resin than oxide-free metal surfaces.

One possibility of treating copper in order to achieve improved bonding of copper to polymeric material is described in EP 1 820 884 A1. For this purpose a solution is employed which comprises an oxidant, such as hydrogen peroxide, at least one acid, such as sulfuric acid, at least one adhesion-enhancing compound, such as a triazole, benzotriazole, imidazole, tetrazole, or purine, and additionally fluoride ions in an amount of at least 100 mg/l and chloride ions in an amount of 5 to 40 mg/l. It has proved however, that treatment of a lead-frame structure, having silver surfaces, with this solution does not affect the silver surface and thus has no influence on the adhesion of the resin to the silver surface.

As this roughening of the copper does not result in improved adhesion between a silver surface present on the lead-frame body structure and the resin, the contact between silver and resin material has believed to be the weakest link between the lead-frame structure and the resin material. For this reason, the silver area relative to that of the copper area being exposed on the lead-frame body structure has until now been minimized.

Further attempts have been made to overcome the problem of deficient adhesion between silver and the resin:

Cui at al.: "*Adhesion Enhancement of Pd Plated Lead-frames*", Electronic Components and Technology Conference, 1999, 837, disclose that iron can be deposited along grain boundaries by applying a cathodic current to a lead-frame in an alkaline solution containing iron. According to the authors, the deposition of iron on the surface of pre-plated frames (PPF; lead-frame being plated with a layer of a metal, in this case palladium) results in improved adhesion to resin material. However, wire bondability is reduced at the same time. Wire bondability deteriorates as more iron is deposited on the surface. Presumably, it is for this reason, and due to the fact that iron is sensitive to oxidation by air, that the method by Cui et al. is not used industrially.

U.S. Pat. No. 5,343,073 A and 5,449,951 A describe lead-frames wherein the adhesion to resin material is to be improved by electrolytic deposition of chromium and zinc. Since the method described in these patents involves the use of chromium (VI), it is disadvantageous with respect to environmental protection requirements. The use of zinc is also disadvantageous since, like iron, and contrary to what is stated in these patents, the bondability of gold wire to zinc is poor.

U.S. Pat. No. 5,300,158 A teaches the use of chromium (VI) for the protection against corrosion and for improving adhesion to substrates consisting of copper or copper alloys.

U.S. Pat. No. 6,852,427 A discloses that a solution containing at least one metal (for example zinc) can be used to protect copper against corrosion and, at the same time, achieves an improvement in adhesion. This document primarily relates to the avoidance of using chromium (VI).

US 2005/0121330 A1 also relates to copper surfaces only. Silver and the bondability of a gold wire to silver surfaces are not considered.

In order to overcome the problem of unsatisfactory adhesion between silver and the resin, WO 2010/043291 A1 describes a method for improving the adhesion between a silver surface and a resin material comprising a step of electrolytically treating the silver surface with a solution containing a hydroxide selected from alkali metal hydroxides, alkaline earth metal hydroxides, ammonium hydroxides and mixtures thereof. In this method, the silver surface of the lead-frame and an anode are brought into contact with this solution and an electric current is passed through the solution to treat the silver surface, while the silver surface acts as a cathode. The silver surface thus treated shows improved adhesion to resin material. This solution may also contain a silicate salt, such as sodium or potassium or ammonium metasilicate.

In spite of the fact that the above mentioned method of WO 2010/043291 A1 can be applied, it has remained common perception that the adhesion between silver and the molding compound will present the weaker interfacial boundary as compared to the copper to resin interface.

Definitions:

The term "lead-frame" as used herein refers to a metallic carrier for one or more semiconductor devices comprising a core which comprises a die pad wherein the die pad is designed to mount one semiconductor device thereon and wherein the lead-frame also comprises outer leads designed to be connected or soldered to a circuit board or the like.

The term "lead-frame structure" as used herein refers to a multiple panel which comprises a plurality of (at least two) lead-frame entities (see herein below), wherein the lead-frame entities form portions of such multiple panel and wherein a lead-frame entity has the outer contour of a lead-frame. It is common to provide such multiple panel in the form of rolls which comprise as many as hundreds of lead-frame entities. Such rolls may be used in reel-to-reel machines. The lead-frames may be obtained by singularizing the lead-frame entities from the multiple panel. But in general, the lead-frame structure is further processed to mount semiconductor devices thereon and to encapsulate same with a resin and only thereafter surface mount electronic devices are obtained by singularization from the resulting multiple panels.

The term "lead-frame entity" as used herein refers to a portion of a lead-frame structure, namely that portion which, if it were detached from the lead-frame structure, would yield a lead-frame. Therefore, the lead-frame entity has the same outer contour as the lead-frame.

The term "lead-frame body" as used herein refers to a single metallic blank used to produce a lead-frame and which has the outer contour of a lead-frame. Within this application this term refers to all intermediate products obtained prior to yielding the lead-frame, i.e., until after completion of treatment layer formation.

The term "lead-frame body structure" as used herein refers to a multiple panel which comprises a plurality of (at least two) lead-frame body entities (see herein below), wherein the lead-frame body entities form portions of such multiple panel and wherein a lead-frame body entity has the outer contour of a lead-frame. A lead-frame body structure is designed to yield a lead-frame structure by using the method of the invention. Within this patent application this term refers to all intermediate products obtained prior to yielding the lead-frame structure, i.e., until after completion of treatment layer formation.

The term "lead-frame body entity" as used herein refers to a portion of a lead-frame body structure, namely that portion which, if it were detached from the lead-frame body structure, would yield a lead-frame body. Therefore, the lead-frame body entity has the same outer contour as the lead-frame body. Within this patent application this term refers to all intermediate products obtained prior to yielding a lead-frame entity, i.e., until after completion of treatment layer formation.

The term "surface mount electronic device structure" as used herein refers to a multiple panel which comprises a plurality of (at least two) surface mount electronic device entities (see herein below), wherein the surface mount electronic device entities form portions of such multiple panel. The surface mount electronic devices of the invention are obtained by singularizing the surface mount electronic device entities from the multiple panel.

The term "surface mount electronic device entity" as used herein refers to a portion of a surface mount electronic device structure, namely that portion which, if it were detached from the surface mount electronic device structure, would yield a surface mount electronic device.

The term (silver, copper) "surface" as used herein either refers to a single surface or to two surfaces, wherein a single surface is meant to be present on a single main side of a lead-frame body (structure) or a single face of a lead-frame (structure) or a lead-frame entity and wherein two surfaces are meant to be present on the two main sides of a lead-frame body (structure) or to be present on the two faces of a lead-frame (structure) or a lead-frame entity, one surface being present on each one of the lead-frame body (structure) or lead-frame (structure) or lead-frame entity.

The term "silver coating" as used herein either refers to a single coating or to two coatings, wherein a single coating is meant to be applied to a single main side of a lead-frame body (structure) or to be present on a single face of a lead-frame (structure) or a lead-frame entity and wherein two coatings are meant to be applied to the two main sides of a lead-frame body (structure) or to be present on the two faces of a lead-frame (structure) or a lead-frame entity, one silver coating being present on each one of the lead-frame body (structure) or lead-frame (structure) or lead-frame entity.

The term "copper" (surface) as used herein refers to both, pure copper and a copper alloy.

The term "silver" (surface) as used herein refers to both, pure silver and a silver alloy.

The terms "encapsulating" and "encapsulated" as used herein either refer to the application of the mold to both faces of the lead-frame (structure) or to the application of the mold to that face of a lead-frame (structure) or a lead-frame entity, where the at least one semiconductor device is mounted. Encapsulation including coating of the two faces of a lead-frame (structure) preferably includes completely surrounding a core region (and die pad region thereon) of a lead-frame (entity) with the mold, while the leads of the lead-frame (entity) remain uncoated.

OBJECT OF THE INVENTION

It is therefore an object of the present invention to provide a method of producing a lead-frame structure having two faces and exposing a treated silver surface on at least one of said two faces, said treated silver surface(s) serving the wire bonding, which method yields a surface which, after applying resin to it, has excellent adhesion of the surface to the mold even under severe testing conditions, such as the IPC/JEDEC J-STD-20 MSL standard.

It is therefore another object of the present invention to provide a lead-frame structure having two faces and exposing a treated silver surface on at least one of said two faces, said treated silver surface(s) serving the wire bonding, which lead-frame structure has a surface which, after applying resin to it, has excellent adhesion of the surface to the mold even under severe testing conditions, such as the IPC/JEDEC J-STD-20 MSL standard.

It is therefore still another object of the present invention to provide a method of producing a lead-frame having two faces and exposing a treated silver surface on at least one of said two faces, said treated silver surface(s) serving the wire bonding, which method yields a surface which, after applying resin to it, has excellent adhesion of the surface to the mold even under severe testing conditions, such as the IPC/JEDEC J-STD-20 MSL standard.

It is therefore still another object of the present invention to provide a lead-frame having two faces and exposing a treated silver surface on at least one of said two faces, said treated silver surface(s) serving the wire bonding, which method yields a surface which, after applying resin to it, has excellent adhesion of the surface to the mold even under severe testing conditions, such as the IPC/JEDEC J-STD-20 MSL standard.

It is therefore still another object of the present invention to provide a method of producing a surface mount electronic device comprising the lead-frame or lead-frame entity and at least one semiconductor device mounted thereon, wherein the lead-frame or lead-frame entity exposes a treated silver surface on at least one of said two faces, wherein the treated silver surface(s) serve(s) the wire bonding, and wherein a resin is applied to the lead-frame or lead-frame entity, and which method yields excellent adhesion of the surface of the lead-frame or lead-frame entity to the mold even under severe testing conditions, such as the IPC/JEDEC J-STD-20 MSL standard.

It is therefore still another object of the present invention to provide a surface mount electronic device comprising the lead-frame or lead-frame entity and at least one semiconductor device mounted thereon, wherein the lead-frame or lead-frame entity exposes a treated silver surface on at least one of the two faces thereof, wherein the treated silver surface(s) serve(s) the wire bonding, and wherein a resin is applied to the lead-frame or lead-frame entity, and which surface mount electronic device has excellent adhesion of the surface of the lead-frame or lead-frame entity to the mold even under severe testing conditions, such as the IPC/JEDEC J-STD-20 MSL standard.

It is therefore another object of the present invention to provide methods which are short and easy to be carried out and which afford low investment and yield low amounts of waste material and prevent using hazardous material.

SUMMARY AND DETAILED DESCRIPTION OF THE INVENTION

According to a first aspect of the present invention, these objects are solved by a method of producing a lead-frame structure having two faces and exposing a treated silver surface on at least one of said two faces, said method comprising the following method steps carried out in this order:

(a) providing a lead-frame body structure having two main sides, said lead-frame body structure exclusively exposing a copper surface on each one of said main sides;

(b) depositing a silver coating on at least one of said main sides, so that said at least one of said main sides at least partially exposes an untreated silver surface; and (c) electrolytically treating said untreated silver surface on said at least one of said main sides generated in method step (b) with a treatment solution containing at least one hydroxide compound selected from alkali metal hydroxides, alkaline earth metal hydroxides, ammonium hydroxides and mixtures thereof, wherein the lead-frame body structure is a cathode, thereby producing said lead-frame structure which comprises at least two lead-frame entities each one having two faces and at least partially exposing said treated silver surface.

These methods steps may be performed directly one after the other or, more preferably, with further method steps being performed between these method steps. These further method steps may for example be rinsing steps. Furthermore, additional method steps may be performed prior to method step (a) and/or after method step (c).

It is provided that said at least one of said two faces of at least one of said at least two lead-frame entities either exclusively exposes said treated silver surface or that said at least one of said two faces of said at least one of said at least two lead-frame entities partially exposes said treated silver surface and partially exposes said copper surface, wherein, on each one of said two faces of each one of said at least two lead-frame entities which partially exposes said treated silver surface, the area of said copper surface is smaller than the area of said treated silver surface.

According to a second aspect of the present invention, these objects are also solved by a lead-frame structure having two faces and exposing a treated silver surface on at least one of said two faces, wherein said lead-frame structure comprises at least two lead-frame entities each one having two faces and wherein said lead-frame structure is made of:
- (ii) at least one of said main sides being coated with a silver coating, so that said at least one of said main sides at least partially exposes an untreated silver surface; and
- (iii) said untreated silver surface on said at least one of said main sides being further provided with a treatment layer obtainable by electrolytically treating said untreated silver surface on said at least one of said main sides of said lead-frame body structure with a treatment solution containing at least one hydroxide compound selected from alkali metal hydroxides, alkaline earth metal hydroxides, ammonium hydroxides and mixtures thereof, wherein the lead-frame body structure is a cathode.

It is provided that said at least one of said two faces of at least one of said at least two lead-frame entities either exclusively exposes said treated silver surface or that said at least one of said two faces of said at least one of said at least two lead-frame entities partially exposes said treated silver surface and partially exposes said copper surface, wherein, on each one of said two faces of each one of said at least one lead-frame entities which partially expose said treated silver surface, the area of said copper surface is smaller than the area of said treated silver surface.

According to a third aspect of the present invention, these objects are also solved by a method of producing a lead-frame having two faces and exposing a treated silver surface on at least one of said two faces, said method comprising the following method steps carried out in this order:
- (a) providing a lead-frame body having two main sides, said lead-frame body exclusively exposing a copper surface on each one of said main sides;
- (b) depositing a silver coating on at least one of said main sides, so that said at least one of said main sides at least partially exposes an untreated silver surface; and
- (c) electrolytically treating said untreated silver surface on said at least one of said main sides generated in method step (b) with a treatment solution containing at least one hydroxide compound selected from alkali metal hydroxides, alkaline earth metal hydroxides, ammonium hydroxides and mixtures thereof, wherein the lead-frame body is a cathode.

These methods steps may be performed directly one after the other or, more preferably, with further method steps being performed between these method steps. These further method steps may for example be rinsing steps. Furthermore, additional method steps may be performed prior to method step (a) and/or after method step (c).

It is provided that said at least one of said two faces of said lead-frame either exclusively exposes said treated silver surface or that said at least one of said two faces of said lead-frame partially exposes said treated silver surface and partially exposes said copper surface, wherein, on each one of said two faces of said lead-frame, the area of said copper surface is smaller than the area of said treated silver surface.

According to a fourth aspect of the present invention, these objects are also solved by a lead-frame having two faces and exposing a treated silver surface on at least one of said two faces and wherein said lead-frame is made of:
- (i) a lead-frame body made of copper and having two main sides;
- (ii) at least one of said main sides being coated with a silver coating, so that said at least one of said main sides at least partially exposes an untreated silver surface; and
- (iii) said untreated silver surface on said at least one of said main sides being further provided with a treatment layer obtainable by electrolytically treating said untreated silver surface on said at least one of said main sides of said lead-frame body with a treatment solution containing at least one hydroxide compound selected from alkali metal hydroxides, alkaline earth metal hydroxides, ammonium hydroxides and mixtures thereof, wherein the lead-frame body is a cathode.

It is provided that said at least one of said two faces of said lead-frame either exclusively exposes said treated silver surface or that said at least one of said two faces of said lead-frame partially exposes said treated silver surface and partially exposes said copper surface, wherein, on each one of said two faces of said lead-frame, the area of said copper surface is smaller than the area of said treated silver surface.

According to a fifth aspect of the present invention, these objects are also solved by a method of producing a surface mount electronic device, said method comprising the following method steps carried out in this order:
- (a) providing a lead-frame body structure having two main sides, said lead-frame body structure exclusively exposing a copper surface on each one of said main sides;
- (b) depositing a silver coating on at least one of said main sides, so that said at least one of said main sides at least partially exposes an untreated silver surface;
- (c) electrolytically treating said untreated silver surface on said at least one of said main sides generated in method step (b) with a treatment solution containing at least one hydroxide compound selected from alkali metal hydroxides, alkaline earth metal hydroxides, ammonium hydroxides and mixtures thereof, wherein the lead-frame body structure is a cathode, thereby producing a lead-frame structure which comprises at least two lead-frame entities each one having two faces and at least partially exposing said treated silver surface;
- (d) mounting at least one semiconductor device on at least one of said at least two lead-frame entities, and bonding said at least one semiconductor device to said treated silver surface, wherein said bond is capable of creating an electrical connection between said at least one of said at least two lead-frame entities and said at least one semiconductor device;
- (e) encapsulating said at least one of said at least two lead-frame entities together with said at least one semiconductor device using a resin material, thereby forming at least one surface mount electronic device structure; and
- (f) singularizing said surface mount electronic device from said surface mount electronic device structure.

These methods steps may be performed directly one after the other or, more preferably, with further method steps being performed between these method steps. These further method steps may for example be rinsing steps. Furthermore, additional method steps may be performed prior to method step (a) and/or after method step (f).

It is provided that said at least one of said two faces of at least one of said at least two lead-frame entities either exclusively exposes said treated silver surface or that said at least one of said two faces of said at least one of said at least two lead-frame entities partially exposes said treated silver surface and partially exposes said copper surface, wherein, on each one of said two faces of each one of said at least two lead-frame entities which partially exposes said treated silver surface, the area of said copper surface is smaller than the area of said treated silver surface.

According to a sixth aspect of the present invention, these objects are also solved by a surface mount electronic device, comprising:
(A) a lead-frame having two faces and exposing a treated silver surface on at least one of said two faces of said lead-frame, wherein said lead-frame is made of:
  (i) a lead-frame body made of copper and having two main sides;
  (ii) at least one of said main sides being coated with a silver coating, so that said at least one of said main sides at least partially exposes an untreated silver surface; and
  (iii) said untreated silver surface on said at least one of said main sides being further provided with a treatment layer obtainable by electrolytically treating said untreated silver surface with a treatment solution containing at least one hydroxide compound selected from alkali metal hydroxides, alkaline earth metal hydroxides, ammonium hydroxides and mixtures thereof, wherein the lead-frame body is a cathode; and
(B) at least one semiconductor device which is mounted on said at least one of said two faces of said lead-frame which exposes said treated silver surface, wherein said at least one semiconductor device is bonded to said treated silver surface on said at least one of said two faces of said lead-frame, wherein said bond is capable of creating an electrical connection between said lead-frame and said at least one semiconductor device,
wherein said at least one semiconductor device and said lead-frame are together encapsulated with a resin material.

It is provided that said at least one of said two faces of said lead-frame either exclusively exposes said treated silver surface or that said at least one of said two faces of said lead-frame partially exposes said treated silver surface and partially exposes said copper surface, wherein, on each one of said two faces of said lead-frame which partially exposes said treated silver surface, the area of said copper surface is smaller than the area of said treated silver surface.

According to a seventh aspect of the present invention, these objects are also solved by a method for producing a lead-frame structure having two faces and exposing a treated silver surface on at least one of said two faces, wherein said lead-frame structure comprises at least two lead-frame entities each one having two faces. Said method comprises:
  electrolytically treating a lead-frame body structure, which has two main sides and which is provided with an untreated silver surface on at least one of said main sides, with a treatment solution, wherein said lead-frame body structure is a cathode, wherein said treatment solution contains at least one hydroxide compound selected from alkali metal hydroxides, alkaline earth metal hydroxides, ammonium hydroxides and mixtures thereof.

Said at least one of said two faces of at least one of said at least two lead-frame entities exclusively exposes said treated silver surface or said at least one of said two faces of said at least one of said at least two lead-frame entities partially exposes said treated silver surface and partially exposes said copper surface, wherein, on each one of said two faces of each one of said lead-frame entities which partially exposes said treated silver surface, the area of said copper surface is smaller than the area of said treated silver surface.

The lead-frames may be produced from a multiple panel (lead-frame structure). Such multiple panel is first provided in the form of the lead-frame body structure of the invention. This multiple panel is processed to yield a lead-frame structure using the method of the invention, wherein this multiple panel comprises at least two lead-frame entities, i.e., elements which may be singularized from this multiple panel and as a result of such singularization yield lead-frames.

The lead-frame comprises two faces which each exposes one lead-frame surface.

The silver surface at least partially covers said at least one of said two faces of the lead-frame or lead-frame structure, wherein the silver coating is either completely present on one face or both faces of the lead-frame or lead-frame structure entities, or the treated silver surface area in all regions (areas added), which correspond to a lead-frame or to individual lead-frames entities on the lead-frame structure, is greater than the copper surface area in said regions on that face of the lead-frame or lead-frame structure entities (or a respective condition applies to each one of both faces of the lead-frame or lead-frame structure entities). If the at least one of said two faces does not completely expose the silver surface in these regions, the silver surface area on this face and in these regions is greater than the respective copper surface area. In a more preferred embodiment, each one of said two faces of the lead-frame or lead-frame structure entities expose a silver surface having 90% silver surface area, relating to said lead-frame region or to all of said lead-frame entity regions (areas added), and a copper surface having 10% copper surface area, relating to all of said regions (areas added). In an even more preferred embodiment, each one of said two faces of the lead-frame or lead-frame structure entities exposes a silver surface having 95% silver surface area, relating to said lead-frame or to all of said lead-frame entity regions (areas added), and a copper surface having 5% copper surface area, relating to all of said regions (areas added). Accordingly, said at least one of the two faces of the lead-frame or lead-frame structure entities at least partially expose silver and the remaining area of this/these face(s) expose copper. Thus, by using any one of the methods of the present invention, the silver coating is generated on a partial surface area on one main side or on both main sides of the lead-frame body or of the lead-frame body structure or it is generated on the entire surface of one main side or of both main sides of the lead-frame body or of the lead-frame body structure. The methods of the invention do not include, however, a method step wherein part of the silver coating is removed, by etching, for example. This latter method step is conventional in the prior art processes in order to minimize silver surface area.

Contrary to the expectation of industry, excellent adhesion between the lead-frame surface and the mold is achieved by exposing copper to a lesser extent by area than treated silver on the surface thereof, such that the area of said copper surface on said lead-frame entities is smaller than the area of said treated silver surface, if the above methods are used and a treatment layer is produced on an untreated silver surface, which is obtained by electrolytically treating said untreated silver surface with said treatment solution containing at least one hydroxide compound, a hydroxide salt, for example, wherein the lead-frame or lead-frame body structure is a cathode. It has turned out that ageing under moisture conditions of the surface mount electronic device comprising the mold applied to the treated silver surface (while no or only a small copper surface area is present) yields better adhesion than in surface mount electronic devices wherein the silver surface area is minimized and the copper surface area is maximized.

It is assumed that this result is due to the fact that moisture-induced copper oxide generation may be advantageous only if copper oxide is generated at a limited thickness only, whereas an excess of copper oxide production will result in a decrease in adhesion. Though not to be bound by theory, it is believed that this decrease in adhesion is prevented by the covering of the copper surface of the lead-frame body or lead-frame body structure with the silver coating. It is further assumed that silver is coated with an oxide layer to a lesser extent than copper due to moisture absorption so that the detrimental effect of an excess formation of the oxide layer is severe with the copper surface only but not with the treated silver surface. Furthermore, by producing the treatment layer obtained by electrolytically treating said untreated silver surface with said treatment solution containing at least one hydroxide compound, wherein the lead-frame body or lead-frame body structure is a cathode, makes an excellent adhesion between the treated silver surface and the resin material possible.

Though not to be bound by theory, it is further believed that treatment with the treatment solution produces an increased oxide layer (treatment layer) on the untreated silver surface while this layer is believed to be very thin and compact so that rupture within this layer cannot occur easily.

The methods of the invention further have the advantage that they are much easier to be carried out than previous methods. This is for example due to the fact that the methods do not involve removing part of the deposited silver to achieve a silver surface as small as possible in order to ensure good adhesion between the lead-frame and the mold. This is because up to now industry aims at presenting a copper surface as large as possible to the mold to ensure good adhesion. Furthermore, it has proved that additional spot plating, to achieve thick silver buildup as was previously carried out, is no longer necessary. Therefore, the method is much shorter, i.e., comprises less method steps than previous methods. This also results in shorter lines, affording less investment, as well as in less consumption of chemicals, especially less noble metal, and less waste to be treated so that environmental issues are also addressed. The present invention has proved to provide good and strongly improved adhesion (even if compared with a flat or roughened copper surface) between the lead-frame and the mold, even if the mold is directly in contact with the treated silver surface exclusively.

Furthermore, the surface mount electronic device of the present invention exhibits higher reliability and quality than previous devices.

It has further proved advantageous over previous methods, lead-frames structures, lead-frames, and surface mount electronic devices that silver coating thickness may be very low. This either enables very much higher production speed in producing the silver coating(s) or, more preferably, makes use of a lower silver plating speed possible so that electric current density with electrochemical silver deposition may be set at a low value for silver plating and, accordingly, silver cyanide plating solutions are no longer required. Therefore, hazardous material may be prevented from being used in the methods of the invention.

In a preferred embodiment of the invention, the lead-frame body or lead-frame body structure is provided with said silver coating so that this coating completely covers said at least one of said main sides, more preferably said one main side, of the lead-frame body or lead-frame body structure which is provided to be connected with the wire bonds. In this case, said at least one of said main sides exclusively exposes a treated silver surface.

Partial coating of the lead-frame body or lead-frame body structure with silver, on the other hand, may be advantageous if only part of the surface of the lead-frame or lead-frame structure entities is brought into contact with the mold, so that the portion of the lead-frame or or the lead-frame structure entities which expose said silver surface is brought into contact with the mold while other surface portions need not expose a treated silver surface. Partial silver coating may also be advantageous for manufacturing reasons, for example when the lead-frame body or lead-frame body structure is conducted through an electroplating bath for the application of silver thereon, wherein the lead-frame body or lead-frame body structure is held by a holding tool which, together with the portion of the lead-frame body or lead-frame body structure being held by the holding tool, is prevented from coming into contact with the bath liquid, so that no silver is deposited on that portion. Furthermore, some areas on said lead-frame or lead-frame structure which may not be in contact with the plastic resin (mold) are not required to enable strong adhesion to the molding compound. This type of area could be the outer lead area of the lead-frame or lead-frame entities where mold flash (bleed) is often found which needs to be removed prior to subsequent tin plating. There, of course, a silver surface ensuring good adhesion to the mold is not favored.

If said at least one of said two faces of the lead-frame or lead-frame structure partially exposes the treated silver surface and partially exposes the copper surface, the treated silver surface on said at least one of said two faces may be formed in one coherent surface region or, alternatively, may be distributed in a plurality of surface regions which are separated from each other.

In a further preferred embodiment of the present invention, the lead-frame body or lead-frame body structure is made of copper or a copper alloy, such as copper/tin alloy, copper/iron/phosphorus alloy, or copper/chromium/tin/zinc alloy.

In a further preferred embodiment of the present invention, at least one surface of the lead-frame body or lead-frame body structure is cleaned prior to treating the lead-frame body or lead-frame body structure for applying silver. Cleaning is preferably performed with conventional methods, including degreasing and pickling.

In a further preferred embodiment of the present invention, the at least one of the lead-frame body or lead-frame body structure is activated prior to treating the lead-frame body or lead-frame body structure for applying silver. This activation may be performed by acid treatment of the copper surface.

In a further preferred embodiment of the present invention, the silver coating is produced using a method wherein silver is deposited using a silver plating solution. The silver surface can consist of substantially pure (>99 wt.-%) silver or of a silver alloy having a sufficiently high silver content (>90 wt.-%, more preferably >95 wt.-%). In general, silver plating is carried out by bringing the lead-frame body or lead-frame body structure in contact with the silver plating solution. This method is not required to be an electrochemical method wherein an external current is flown between the lead-frame body or lead-frame body structure and a counter electrode, both being in contact with the silver plating solution, though an electrochemical method might be applicable. In one embodiment, silver plating may therefore be performed by a chemical (immersion or electroless) plating method, wherein no electric current is passed between the cathodic lead-frame body or lead-frame body structure, which is in contact with the silver plating solution, and an anode. The silver plating solution may be a water-based solution containing a silver complex compound (and optionally containing other metals which are to be deposited), wherein the silver complex compound may preferably be a silver cyanide or another silver complex compound. The silver plating solution may be an electrolytic silver strike plating composition or a silver immersion plating composition or an electroless silver plating composition. The strike plating composition is used in an electrochemical plating method wherein silver is deposited by virtue of electric current flowing through the lead-frame body or lead-frame body structure. In immersion plating, silver is deposited on the copper surface of the lead-frame body or lead-frame body structure while copper dissolves into this solution as copper ions. Typical compositions of the silver strike, silver immersion, and electroless silver plating solutions are well-known to those skilled in the art.

The silver surface thus produced can consist of substantially pure (>99 wt.-%) silver or of a silver alloy having a sufficiently high silver content (>95 wt.-%). For producing a 0.1 μm thick silver coating, electrochemical plating treatment in a cyanide containing silver plating solution is performed for from 5 to 120 s, more preferably from 5 to 60 s, even more preferably from 7 to 30 s and most preferably from 8 to 20 s, for example for 10 s. Plating duration with non-cyanide silver plating is from 1.5 to 2.5 times, preferably 2 times, these values (value ranges). Electrochemical plating is preferably performed at from 0.25 to 3.0 A/dm$^2$, preferably from 0.5 to 1 A/dm$^2$. Depending on the type of silver plating solution, it is preferably operated at a temperature ranging from 10 to 60° C., for example.

In a further preferred embodiment of the present invention, the silver coating produced is at most 2 μm thick. In an even more preferred embodiment, the silver coating is at most 1.5 μm thick, even more preferably at most 1 μm, even more preferably at most 0.5 μm, even more preferably at most 0.25 μm, even more preferably at most 0.15 μm and most preferably about (±0.02 μm) 0.1 μm thick. The silver coatings have a minimum thickness which may be as small as at least 0.005 μm, even more preferably at least 0.01 μm, even more preferably at least 0.025 μm, even more preferably at least 0.04 μm and most preferably about (±0.02 μm) 0.07 μm.

In a further preferred embodiment of the present invention, the untreated silver surface produced on the lead-frame body or lead-frame body structure is treated with said treatment solution containing said at least one hydroxide compound. This method step is preferably carried out prior to mounting and bonding the at least one surface mount device to the lead-frame or lead-frame structure (method step (d)), but may in principle also be carried out after bonding has taken place.

To perform this method step, the lead-frame body or lead-frame body structure and at least one anode are brought into contact with the treatment solution, and a voltage is applied between the untreated silver surface of the lead-frame body or lead-frame body structure, acting as the cathode, and the at least one anode so as to pass an electric current through the solution. The silver surface thus treated shows improved adhesion to resin materials, in particular those used as mold materials for the manufacture of electronic components such as SMDs.

It has proved that this treatment generates a very thin silver oxide layer (treatment layer) at the surface of the silver coating which may be detected by XPS (X-ray photoelectron spectroscopy). Thickness of this treatment layer has been established to be from 0.5 to 2 nm (0.0005 to 0.002 μm).

In a further preferred embodiment of the present invention, treatment of the untreated silver surface of the lead-frame body or lead-frame body structure with the treatment solution is carried out by polarizing the lead-frame body or lead-frame body structure as a cathode. The current density applied in this method step is not particularly limited. Generally, the cathodic density may be from 2 to 40 A/dm$^2$, preferably from 4 to 32 A/dm$^2$. When the treatment solution contains the at least one hydroxide compound only and no further components (when it for example contains sodium hydroxide in water only), the cathodic density will generally be from 8 to 24 A/dm$^2$, preferably from 12 to 16 A/dm$^2$. When the treatment solution additionally contains a silicate, the cathodic density will generally be from 4 to 16 A/dm$^2$, preferably from 8 to 12 A/dm$^2$. Generally, a higher current density will result in greater improvement in adhesion. In principle, the current density is limited only by the voltage applied between the cathode and anode(s).

The temperature of the treatment solution will preferably range from 15 to 75° C., more preferably from 20 to 50° C. and most preferably from 35 to 45° C.

In a further preferred embodiment of the present invention, the duration of the treatment of the untreated silver surface with the treatment solution is not particularly limited. Generally, this duration will range from 5 to 300 s, preferably from 25 to 60 s. Generally, longer durations of the treatment will not result in greater improvements of adhesion between the silver surface and the resin material. However, longer durations may be disadvantageous, especially when the treatment is carried out in a continuous mode where the lead-frame bodies or lead-frame body structures are moved through the treatment bath and long treatment durations might thus require excessively long distances from one end of the bath to the other. Short treatment durations may be achieved by increasing the cathodic current density accordingly. This may require an appropriate increase in the size of the anode(s) to avoid excessive voltage.

In a further preferred embodiment of the present invention, alkali metal hydroxide compounds are sodium hydroxide (NaOH) and potassium hydroxide (KOH). Suitable ammonium hydroxide compounds are ammonium hydroxides having general formula NR$_{4-n}$H$_n$OH, wherein each R is independently selected from alkyl groups having 1 to 12, preferably 1 to 6, carbon atoms. Preferred hydroxide compounds are sodium hydroxide and potassium hydroxide.

The concentration of the at least one hydroxide compound in the treatment solution is generally from 10 to 500 g/l, preferably from 100 to 200 g/l, for example about 150 g/l. A lower concentration of hydroxides is generally sufficient if the treatment solution contains any one of a conductivity-enhancing salt described below.

In a further preferred embodiment of the present invention, the treatment solution additionally contains at least one silicate salt, such as sodium or potassium or ammonium metasilicates. Sesquisilicates, such as Na$_3$HSiO$_4$.5 H$_2$O or the corresponding alkali and ammonium salts, may also be used. Preferred silicate salts are polysilicates, preferably soluble alkali metal or ammonium polysilicates, which may be described by the formula M$_2$O.n SiO$_2$, wherein n is about 1 to 4 and M is an alkali metal or an ammonium ion having general formula $NR_{4-n}H_n^+$, wherein each R is independently an alkyl group having 1 to 12, preferably 1 to 6, carbon atoms.

It has been found that the presence of such silicates in the treatment solution results in even greater improvements in adhesion between the treated silver surface and resin. The concentration of the silicate salt in the treatment solution, if used, will generally be from 1 to 100 g/l, preferably from 10 to 50 g/l.

Optionally, the treatment solution may contain one or more conductivity-enhancing salts. Preferred conductivity-enhancing salts are sulfates and polyphosphates, preferably with alkali, ammonium, or alkaline earth cations, for example, sodium or potassium sulfate or sodium or potassium tripolyphosphate ($Na_5P_3O_{10}$ or $K_5P_3O_{10}$). The corresponding ammonium salts may also be used. Such conductivity-enhancing salts can be used to reduce the voltage between the cathode (lead-frame body or lead-frame body structure) and the anode(s) and to increase current density. The concentration of the conductivity-enhancing salts in the treatment solution, if used, will generally be from 1 to 100 g/l, preferably from 10 to 50 g/l. Such salts were found not to have an adhesion-enhancing effect when used alone.

The pH of the treatment solution is >7, preferably >10.

Furthermore, the treatment solution may contain one or more surfactants, which may be ionic or non-ionic. The method step of treating the untreated silver surface with the treatment solution dispenses with depositing any metals on the silver surface.

In a further preferred embodiment of the present invention, any copper surface present on the lead-frame or lead-frame structure is treated with a copper anti-tarnishing solution. This solution may be an aqueous solution of benzotriazole. Anti-tarnishing in this solution is performed for from 5 to 120 s, more preferably from 5 to 60 s, even more preferably from 7 to 30 s and most preferably from 8 to 20 s, for example for 10 s. The copper anti-tarnish solution is preferably operated at 30 to 50° C., for example. If said at least one of said two faces of the lead-frame (entities) exclusively exposes a treated silver surface, anti-tarnishing will not be necessary so that this method step can be omitted.

In a further preferred embodiment of the present invention, the lead-frame or lead-frame structure provided with the treatment layer on the silver coating is further provided with an organic protection coating which prevents epoxy bleed-out of the mold.

The semiconductor device(s) or the like is/are then mounted to the lead-frame or lead-frame structure thus produced. Subsequently, the semiconductor device(s) is/are bonded with a gold wire, for example, to the lead-frame or lead-frame structure using a known process, in particular by TSB. The gold wire is welded to the treated silver surface on the lead-frame or lead-frame structure.

Thereafter, the cores of the lead-frame or lead-frame entities where the at least one semiconductor device is mounted (die pad) and the at least one semiconductor device are encapsulated with a mold or a mold is at least applied to that face of the lead-frame or lead-frame structure where at least one semiconductor device is mounted.

Finally, the surface mount electronic device structures comprising the semiconductor devices which are encapsulated with the mold are treated with a singularization method to yield individual surface mount electronic devices. Such singularization may in one embodiment of the invention be performed using a punching, cutting, or sawing method.

In a further preferred embodiment of the present invention, the resin material which is used to form the mold can be an epoxy resin or an epoxy-molding compound, such as the commercially available product Sumitomo EME-G600™, which consists of 75 to 95 wt.-% of phenol resin and 0.1 to 0.5 wt.-% of carbon black, or the molding compound Sumitomo EME 7351 TQ™, which consists of about 86 wt.-% of silica powder, about 1.0 wt.-% of antimony trioxide, about 11 wt.-% of epoxy resin, about 1.0 wt.-% of bromated resin, and about 1.0 wt.-% of catalyst, flexibilizer, mold release compound, pigment, and primer. The molding compound can also be a bromine-free ("green") molding material consisting of about 80 wt.-% of fused silica, a flexible epoxy resin and hardener, transition metal oxide/nitrogen flame retardants, rubber or thermoplastic flexibilizer and silanes.

The figures shown hereinafter and illustrating the examples explain the present invention in more detail. This explanation is not to be considered a limitation of the scope of the invention but simply serves as its exemplification.

Figure 1:
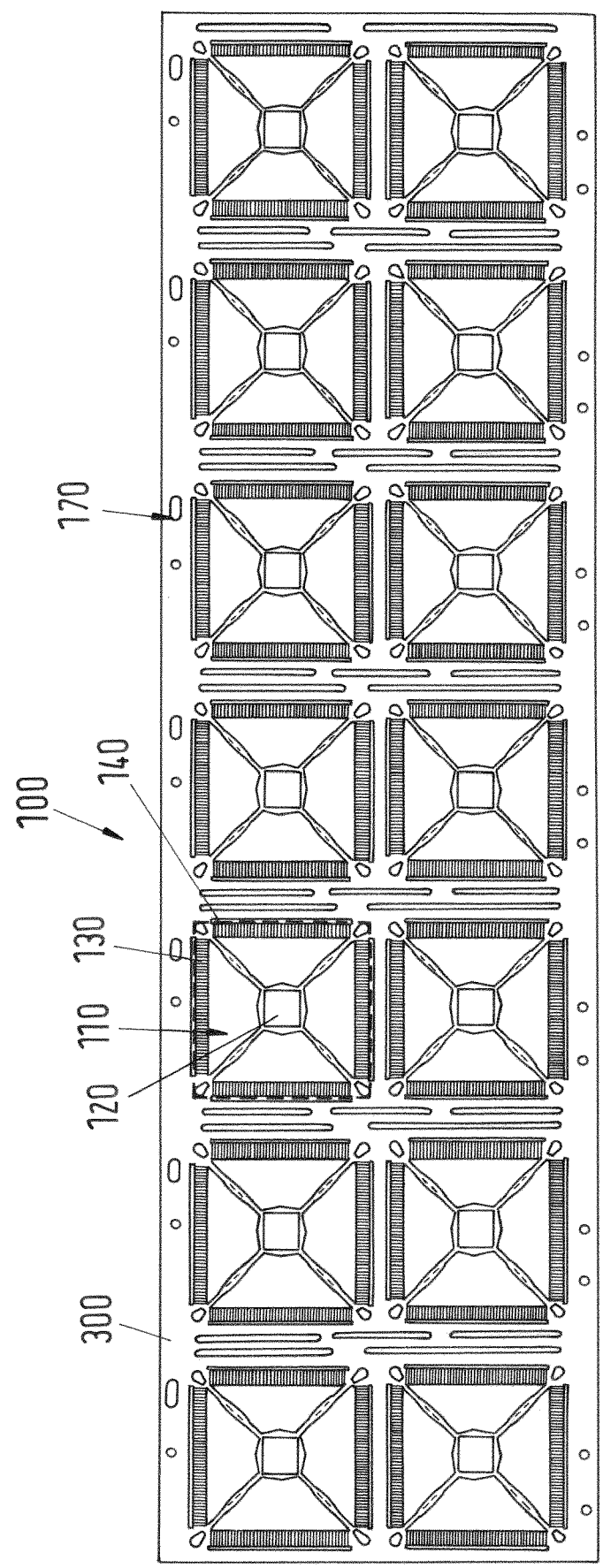
FIG. 1 shows a first embodiment of a lead-frame structure (multiple panel of lead-frame entities) in a top view.
Figure 2:
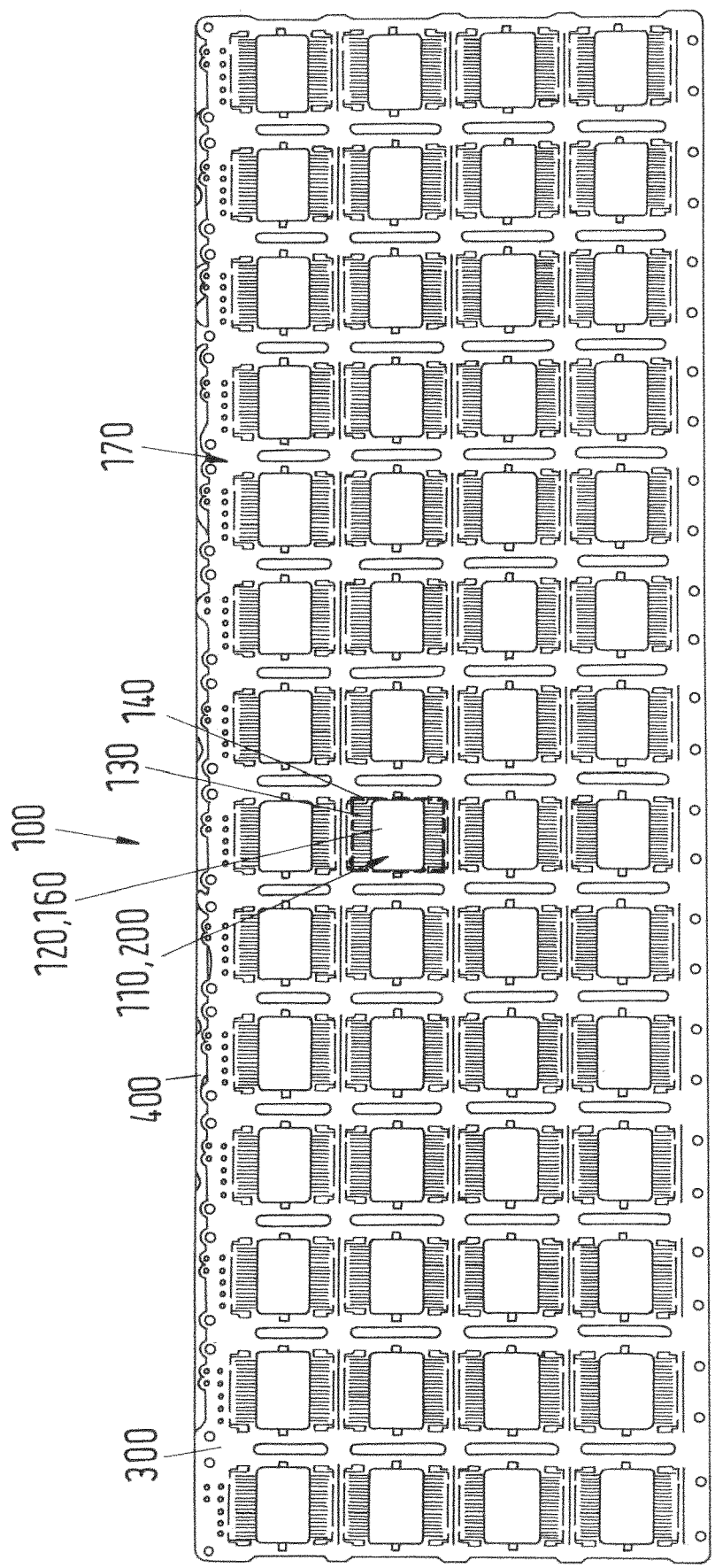
FIG. 2 shows a multiple panel of surface mount electronic device entities (surface mount electronic device structure) comprising a lead-frame structure (multiple-panel; second embodiment) in a top view.

FIGS. 1 and 2 show embodiments of lead-frame structures 100 comprising a plurality of lead-frame entities 110 (to be singularized to yield a plurality of lead-frames or surface mount electronic devices 200, respectively). The figures show the upper faces 170 of the lead-frame structures.

FIG. 1 shows a multiple panel 100 of lead-frame entities 110 in a first embodiment. This multiple panel (lead-frame structure) comprises 14 lead-frame entities as well as portions 300 of this multiple panel which to not pertain to these entities and which due to the singularizing step are removed. Each lead-frame entity comprises a core with die pad 120 where a semiconductor device (for example IC chip, not shown) may be mounted and a plurality of legs 130 which serve the external connection to a circuit board or the like. Wire bonding is performed from the semiconductor device mounted to the core to the individual legs. Singularization of a lead-frame (or of a surface mount electronic device once the semiconductor device is mounted and bonded to the lead-frame entity and the lead-frame entity and semiconductor device are encapsulated) is performed along the dashed line 140.

FIG. 2 shows a multiple panel 100 of lead-frames entities 110, which have semiconductor devices (not shown) being mounted thereon and bonded to the lead-frame entities and which are together with the semiconductor devices encapsulated with a mold 160. Thus, this multiple panel contains a plurality of entities of surface mount electronic devices 200 which may be singularized from this panel as is shown along the dashed line 140. Residual portions 300 of the panel are scrap.

Both embodiments shown in FIGS. 1, 2 are coated with silver: The multiple panel 100 shown in FIG. 1 is completely coated with silver, thus exclusively exposing a treated silver surface on that face which is shown (100% silver surface coverage), whereas the panel 100 shown in FIG. 2 is almost completely coated with silver. In this latter case, an upper edge region 400 of the panel is left free from silver, thus exposing the underlying copper surface. This area not being coated with silver is due to the fact, that the panel (lead-frame body structure) has been immersed into a silver plating bath to coat silver thereon, with the exception of this upper edge region, so that no silver was plated in this region. As this region is not part of the regions of the lead-frame entities 110 however, this copper surface is not considered as a copper surface area in the condition of partial exposure of treated silver surface according to the present invention: In this example, the lead-frame entities are completely coated with silver (as is indicated by the area surrounded by the dashed line 140, for example), so that silver surface coverage in this case is 100% and copper surface coverage is 0%.

EXAMPLES

Sample Preparation:

Strips of C194 copper (copper alloy having 97 wt.-% copper, 3 wt.-% iron, phosphorus and zinc) of 30 cm length and 5 cm width were treated with the method shown in Table 1. The strips were rinsed between successive process steps. A silver coating was deposited on the copper strips and finally treated with the treatment solution containing at least one hydroxide compound using a cathodic treatment. The silver coating completely covered the copper strips and had the thickness as specified.

Three control samples were prepared, namely a first sample which was only silver plated (3 μm thickness silver coating), but not further treated at all ("Control #1": "Ag— Untreated"), a second sample which was silver plated (3 μm thickness silver coating) and then treated with the treatment solution containing at least one hydroxide compound ("Control #2": "Ag—AgPrep") and a third sample which was neither plated with silver nor treated with any other treatment agent ("Control #3": "Cu C194—Untreated"). Silver plating was carried out at the entire surfaces of both sides of the strips.

Further, six samples ("Sample #0", "Sample #1", "Sample #2", "Sample #3", "Sample #4", "Sample #5") were prepared using the method of the invention including silver plating and treatment with the treatment solution ("AgPrep") containing at least one hydroxide compound. These samples differed in thickness of the silver coatings. The samples and relevant parameters are listed in Table 2.

After carrying out the treatments on the strips, eight plastics buttons (cylindrically-shaped buttons having 3 mm diameter and 3 mm height of resin material (epoxy resin) were molded onto one main side of the strip. After the application of the buttons, all the strips were post-mold-cured (Post Mold Cure: 2 hours at 175° C.). Adhesion of the buttons to the strip was then tested by shearing them off the strip and the shear force $F_{shear}$ [MPa] was measured.

In a first test flow (Test Flow 1), the strips were then examined as prepared, i.e., without any further treatment, by measuring the shear-off force $F_{shear}$.

In a second test flow (Test Flow 2), the strips were heat-loaded ("Heat Loading A", "Extreme Heat Loading") prior to molding the buttons on the silver coating. Heat Loading A consisted of one heat treatment cycle with a peak temperature $T_2$=300° C. (initially rising the temperature linearly up to $T_1$=280° C., then holding the temperature at $T_1$, then linearly rising the temperature to $T_2$, then linearly decreasing the temperature to $T_3$=280° C., then holding the temperature at $T_3$, and finally linearly decreasing the temperature to ambient temperature). Total duration of Heat Loading A was about 6 min. Thereafter the shear-off force $F_{shear}$ was measured.

In a third test flow (Test Flow 3), after the post-mold cure, the strips were steam aged and thereafter heat loaded ("Heat Loading B", "Moisture Stress"). No heat treatment took place prior to the molding. Heat Loading B consisted of a preconditioning at 93° C. and 93% relative humidity (93% RH) for 18 hours. Heat Loading B consisted of three heat treatment cycles with a peak temperature of 260° C. each (initially rising the temperature linearly up to $T_1$=150° C., then holding the temperature at $T_1$, then linearly rising the temperature to $T_2$=200° C., then holding the temperature at $T_2$, then further linearly rising the temperature to $T_3$=260° C., and finally linearly decreasing the temperature to ambient temperature). Total duration of Heat Loading B was about 6 min. After Heat Loading B the shear-off force $F_{shear}$ was measured.

Test Method:

Shear force $F_{shear}$ was evaluated by measuring the force required to shear off the buttons from the strips. A measuring device manufactured by DAGE (4000 Plus) was used for this purpose. Shear force was applied at an angle of 90° and at a rate of 50 mm/min over a distance of 100 mm. The force which was required to shear off a respective button was established as the shear force $F_{shear}$ (in MPa).

Figure 3:
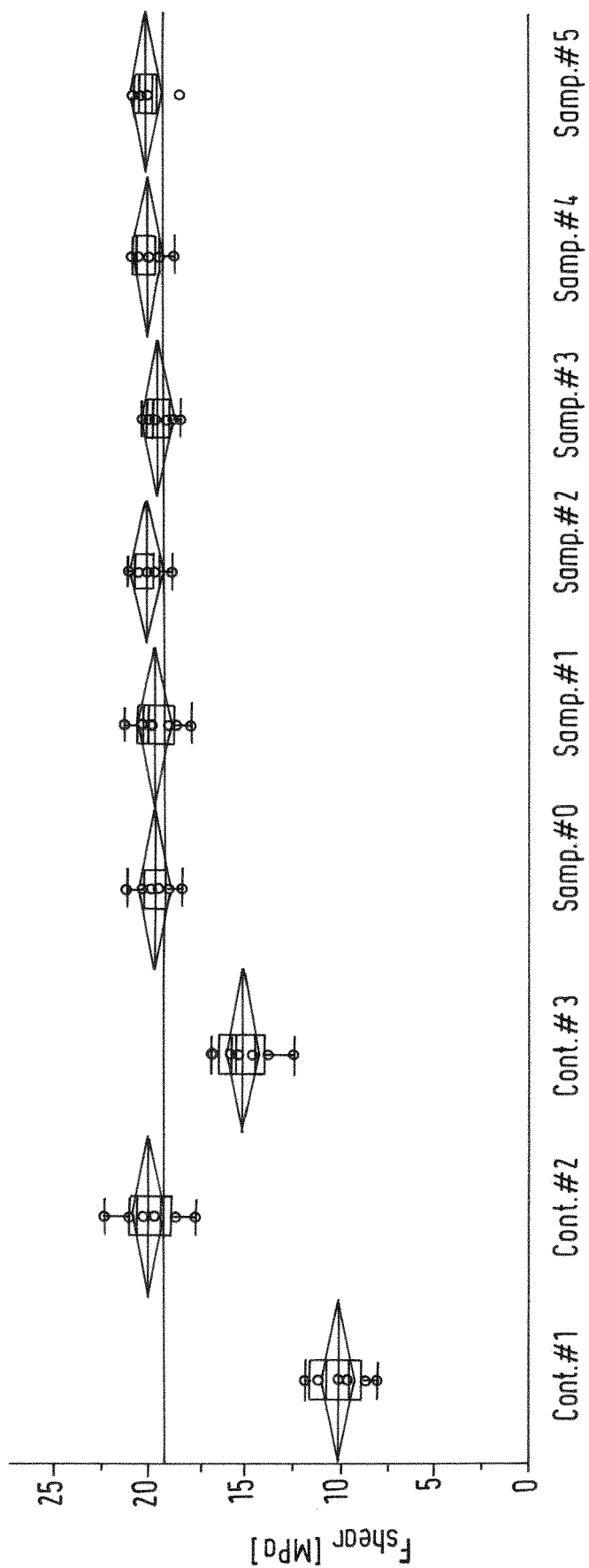
FIG. 3 shows a graph displaying the adhesion of the mold to a lead-frame material in terms of the force $F_{shear}$ used to shear off buttons applied to lead-frame material; samples examined as they are (Test Flow 1)

Results:

Results of the shear-off force obtained with Test Flow 1 (samples as prepared) are shown in Table 3 and graphically displayed in FIG. 3 (box plots showing mean values and standard deviations of measured shear force values). Each sample yields eight measurements as obtained from the eight buttons.

Figure 4:
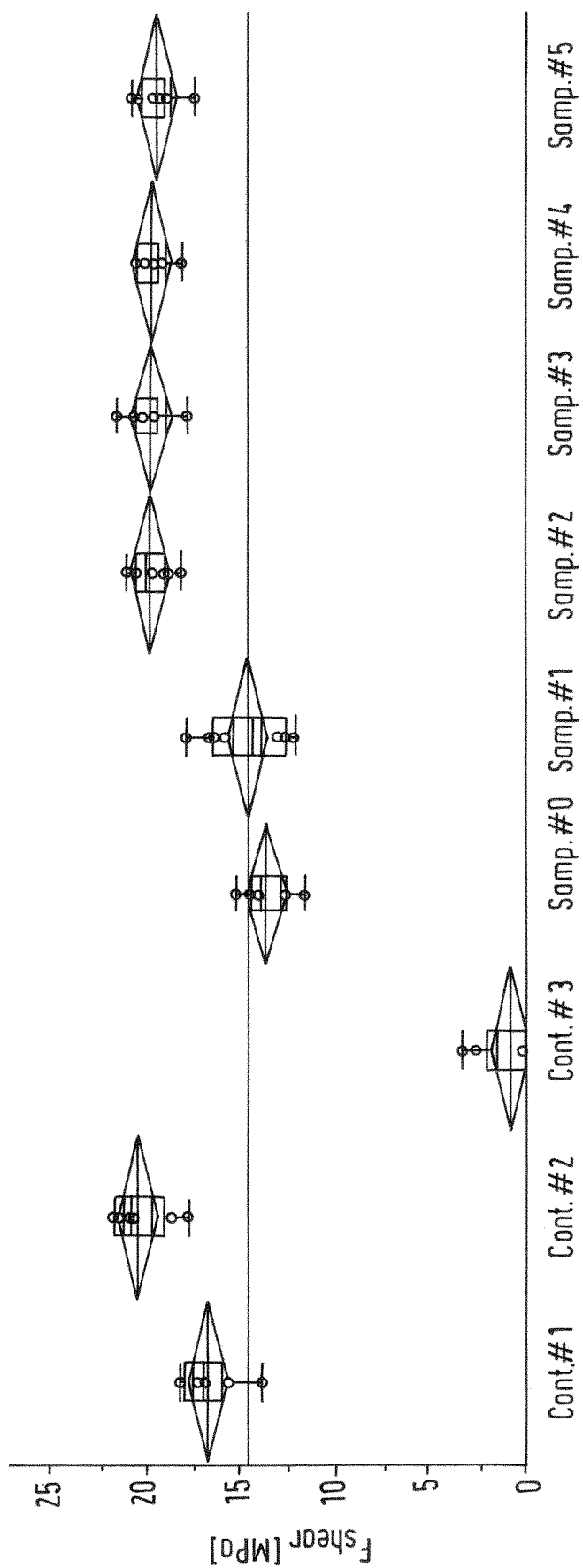
FIG. 4 shows a graph displaying the adhesion of the mold to a lead-frame material in terms of the force $F_{shear}$ used to shear off buttons applied to the lead-frame material; samples examined after extreme heat loading (Test Flow 2)

Results of the shear-off force obtained with Test Flow 2 (Extreme Heat Loading) are shown in Table 4 and graphically displayed in FIG. 4 (box plots showing mean values and standard deviations of measured shear force values). Each sample yields eight measurements as obtained from the eight buttons.

Figure 5:
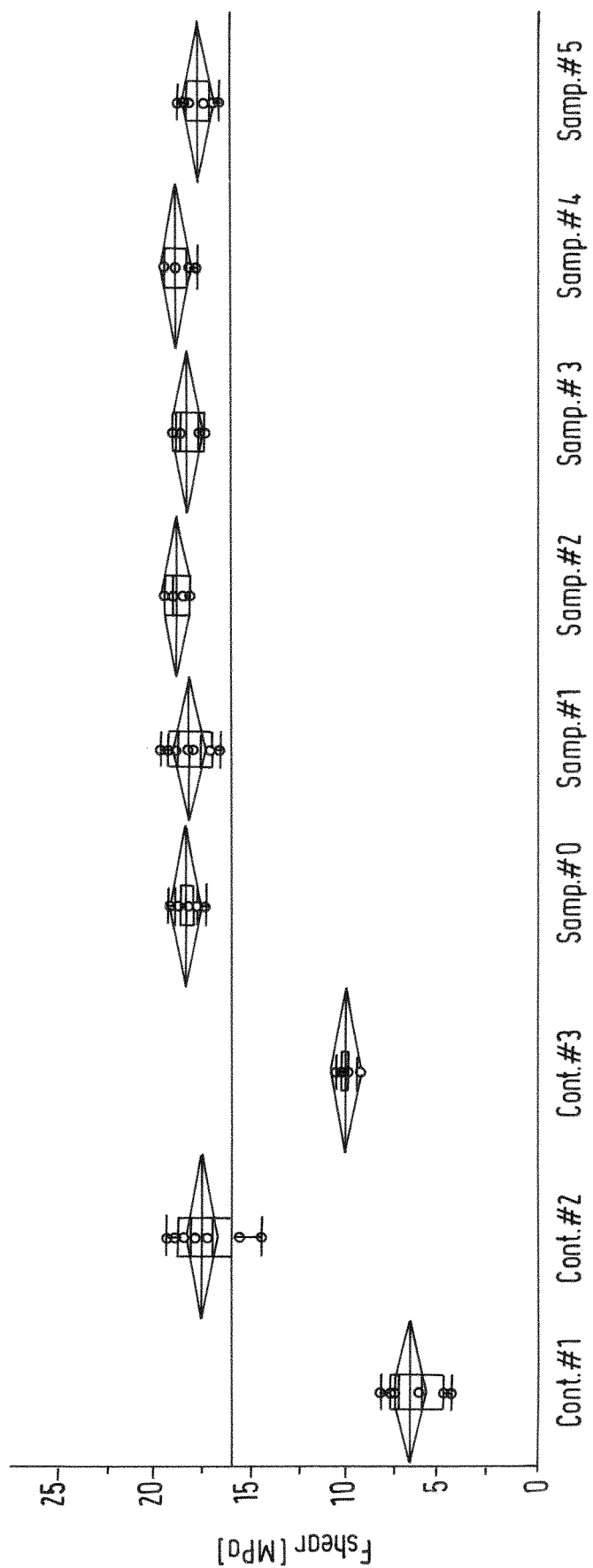
FIG. 5 shows a graph displaying the adhesion of the mold to a lead-frame material in terms of the force $F_{shear}$ used to shear off buttons applied to the lead-frame material; samples examined after moisture stress (Test Flow 3)

Results of the shear-off force obtained with Test Flow 3 (Moisture Stress) are shown in Table 5 and graphically displayed in FIG. 5 (box plots showing mean values and standard deviations of measured shear force values). Each sample yields eight measurements as obtained from the eight buttons.

Figure 6:
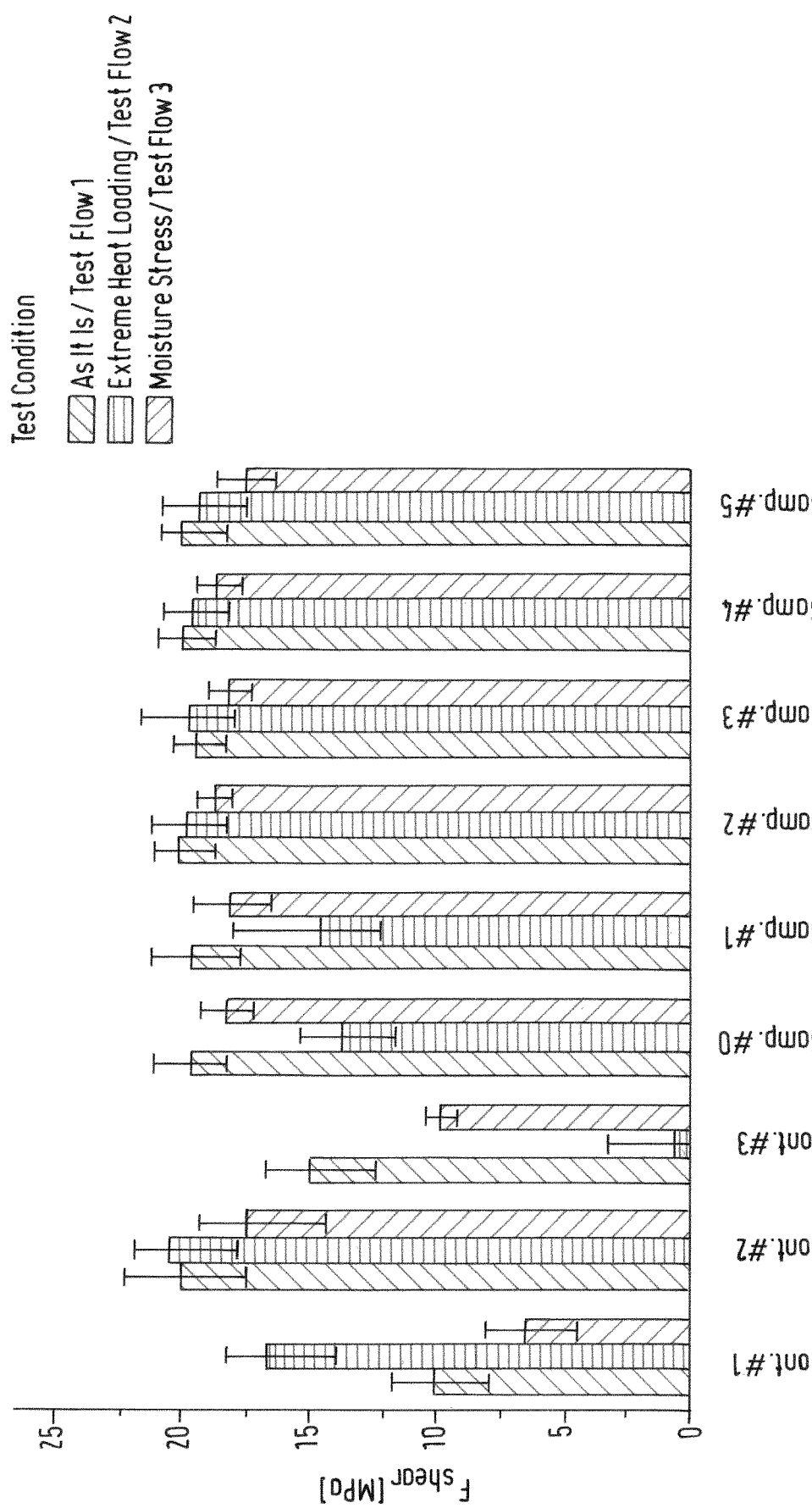
FIG. 6 shows a graph displaying the adhesion of the mold to a lead-frame material in terms of the force $F_{shear}$ used to shear off buttons applied to the lead-frame material; mean values obtained with Test Flows 1, 2, 3.

A graph summarizing the results of all tests done on all samples is given in FIG. 6. The results shown in this figure are the mean values obtained from Tables 3 to 5. This figure confirms the following:

Excellent adhesion (high shear force) is achieved in all cases where the method of the invention was carried out, i.e., with the silver coating being deposited over the entire surface of the sample and therefore covering not only part of the interface between the mold button and the strip but the whole interface (Samples #0 to #5): better adhesion would not be achieved if only part of this interface would be covered by the silver coating as will be apparent from the comparison result obtained with Control #3 where the entire interface consisted of copper, as compared to Control #1 (entire surface coated with 3 μm silver).

The shear force attains a high level (almost 20 MPa) at very thin silver coatings, such thickness being as thin as 0.08 μm (Samples #2 to #5); even with a sample being coated with silver at 0.02 μm thick, a high shear force was achieved (Sample #0), lying between about 15 and almost 20 MPa, which was almost as high as a respective sample having a silver coating of 3 μm thick (Control #2).

Silver yields a higher shear force than copper (Control #1 vs. Control #3), at least if an extreme heat loading is carried out (Test Flow 2).

Treatment with the treatment solution containing at least one hydroxide compound yields a considerably higher shear force than without such treatment (Control #1 vs. Control #2).

From this it is evident that providing the silver coating to the entire surface of the lead-frame body or lead-frame body structure will lead to achieve excellent adhesion between the lead-frame surface and the mold. Furthermore, it emerges that high thickness of silver is not necessary to establish good adhesion to the mold. It has further been ascertained that low thickness of silver is also sufficient to ensure good electrical bonding of the SMDs to the silver surface when TSB is used.

TABLE 1

| Process Flow | | | |
|---|---|---|---|
| Process Step | Temperature | Duration | Other |
| 1. Cleaning: alkaline degreasing | ambient | 15 s | N/A |
| 2. Predip (Acid activation) | ambient | 10 s | N/A |
| 3. Silver strike (silver cyanide) | ambient | 10 s | 1 A/dm$^2$ |
| 4. Silver treatment AgPrep 26L (150 g/l NaOH) | ambient | 30 s | 12 A/dm$^2$ |

TABLE 2

| Samples | | |
|---|---|---|
| Sample | Category | Process Details |
| Control #1 | Control Group | Ag-Untreated |
| Control #2 | | Ag-AgPrep |
| Control #3 | | Cu C194-Untreated |
| Sample #0 | New Process Flow (Table 1) | Thin Ag 0.021 μm + AgP 26L |
| Sample #1 | | Thin Ag 0.042 μm + AgP 26L |
| Sample #2 | | Thin Ag 0.083 μm + AgP 26L |
| Sample #3 | | Thin Ag 0.125 μm + AgP 26L |
| Sample #4 | | Thin Ag 0.166 μm + AgP 26L |
| Sample #5 | | Thin Ag 0.208 μm + AgP 26L |

TABLE 3

| Shear Force - Test Flow 1 | | | | | | | | | |
|---|---|---|---|---|---|---|---|---|---|
| Button | Cont. #1 | Cont. #2 | Cont. #3 | Samp. #0 | Samp. #1 | Samp. #2 | Samp. #3 | Samp. #4 | Samp. #5 |
| 1 | 8.012 | 17.510 | 16.767 | 19.811 | 21.256 | 21.142 | 20.217 | 20.601 | 20.530 |
| 2 | 8.573 | 20.417 | 15.731 | 20.339 | 18.618 | 19.869 | 20.097 | 20.994 | 20.443 |
| 3 | 11.719 | 21.072 | 16.526 | 19.894 | 20.316 | 20.592 | 20.356 | 19.782 | 20.598 |
| 4 | 10.087 | 18.511 | 12.395 | 18.336 | 17.782 | | 18.357 | 19.651 | 18.320 |
| 5 | 9.889 | 21.124 | 13.787 | 21.142 | 20.620 | 20.688 | 19.724 | 20.134 | 20.866 |
| 6 | 11.103 | 19.657 | 15.969 | 19.600 | 20.480 | 20.254 | 19.843 | 20.993 | 20.161 |
| 7 | 11.767 | 22.294 | 15.304 | 19.658 | 18.921 | 19.798 | 18.744 | 19.917 | 20.822 |
| 8 | 9.680 | 19.903 | 14.504 | 19.005 | 19.818 | 18.798 | 19.089 | 18.725 | 19.724 |
| Ave | 10.104 | 20.061 | 15.123 | 19.723 | 19.726 | 20.163 | 19.553 | 20.100 | 20.183 |
| Max | 11.767 | 22.294 | 16.767 | 21.142 | 21.256 | 21.142 | 20.356 | 20.994 | 20.866 |
| Min | 8.012 | 17.510 | 12.395 | 18.336 | 17.782 | 18.798 | 18.357 | 18.725 | 18.320 |

TABLE 4

| Shear Force - Test Flow 2 | | | | | | | | | |
|---|---|---|---|---|---|---|---|---|---|
| Button | Cont. #1 | Cont. #2 | Cont. #3 | Samp. #0 | Samp. #1 | Samp. #2 | Samp. #3 | Samp. #4 | Samp. #5 |
| 1 | 17.131 | 21.845 | 3.360 | 14.518 | 18.033 | 21.245 | 19.557 | 20.795 | 19.857 |
| 2 | 17.392 | 21.082 | 2.637 | 15.403 | 16.679 | 20.778 | 20.775 | 19.607 | 17.563 |
| 3 | 17.097 | 20.908 | 0.000 | | 16.552 | 20.574 | | 20.530 | 19.588 |
| 4 | 13.995 | 18.785 | 0.000 | 12.718 | 12.292 | 18.297 | 18.011 | 18.215 | 18.991 |
| 5 | 18.278 | 21.864 | 0.000 | 13.928 | 12.755 | 19.075 | 21.635 | 20.007 | 20.839 |
| 6 | 18.291 | 20.769 | 0.000 | 14.220 | 12.770 | 20.686 | 19.541 | 19.388 | 20.581 |
| 7 | 16.943 | 21.638 | 0.000 | 14.147 | 13.183 | 19.781 | 20.229 | 20.375 | 19.396 |
| 8 | 15.747 | 17.856 | 0.000 | 11.611 | 15.915 | 19.214 | 19.502 | 19.754 | 19.806 |
| Ave | 16.859 | 20.593 | 0.750 | 13.799 | 14.772 | 19.956 | 19.893 | 19.834 | 19.578 |
| Max | 18.291 | 21.864 | 3.360 | 15.403 | 18.033 | 21.245 | 21.635 | 20.795 | 20.839 |
| Min | 13.995 | 17.856 | 0.000 | 11.661 | 12.292 | 18.297 | 18.011 | 18.215 | 17.563 |

TABLE 5

Shear Force - Test Flow 3

| Button | Cont. #1 | Cont. #2 | Cont. #3 | Samp. #0 | Samp. #1 | Samp. #2 | Samp. #3 | Samp. #4 | Samp. #5 |
|---|---|---|---|---|---|---|---|---|---|
| 1 | 7.470 | 17.214 | 10.412 | 18.183 | 19.277 | 19.021 | 18.692 | 18.743 | 18.279 |
| 2 | 4.512 | 18.333 | 10.193 | 18.702 | 18.270 | 19.399 | 18.740 | 19.424 | 17.453 |
| 3 |  | 19.359 | 10.275 | 19.280 |  | 19.431 | 19.018 | 18.989 | 16.885 |
| 4 | 4.849 | 15.500 | 9.200 | 17.309 | 16.949 | 18.133 | 17.398 | 18.252 | 16.458 |
| 5 | 8.102 | 18.580 | 10.060 | 18.288 | 16.524 | 18.397 | 18.812 | 19.327 | 18.085 |
| 6 | 7.727 | 14.387 | 9.907 | 18.619 | 17.903 | 19.047 | 18.525 | 19.510 | 18.688 |
| 7 | 7.471 | 18.930 | 9.837 | 17.969 | 18.737 | 18.994 | 17.335 | 18.820 | 18.162 |
| 8 | 6.149 | 17.909 | 9.856 | 18.468 | 19.606 | 18.092 | 17.564 | 17.736 | 17.178 |
| Ave | 6.611 | 17.527 | 9.968 | 18.352 | 18.181 | 18.812 | 18.260 | 18.850 | 17.649 |
| Max | 8.102 | 19.359 | 10.412 | 19.280 | 19.606 | 19.431 | 19.018 | 19.510 | 18.688 |
| Min | 4.512 | 14.387 | 9.200 | 17.309 | 16.524 | 18.092 | 17.335 | 17.736 | 16.458 |

LIST OF REFERENCES

100 Lead-frame structure, multiple panel of lead-frame (entities)
110 Lead-frame entity
120 Core
130 Leg
140 Singularization path, dashed line
150 Copper surface
160 Mold (resin)
170 Upper face
200 Surface mount electronic device
300 Portions which do not pertain to lead-frame entities
400 Face region not coated with silver

The invention claimed is:

1. A method of producing a lead-frame structure having two faces and exposing a treated silver surface on at least one of said two faces, said method comprising the following method steps carried out in this order:
   (a) providing a lead-frame body structure having two main sides, said lead-frame body structure exclusively exposing a copper surface on each one of said main sides;
   (b) depositing a silver coating on at least one of said main sides, so that said at least one of said main sides at least partially exposes an untreated silver surface; and
   (c) electrolytically treating said untreated silver surface on said at least one of said main sides generated in method step (b) with a treatment solution containing at least one hydroxide compound selected from alkali metal hydroxides, alkaline earth metal hydroxides, ammonium hydroxides and mixtures thereof, wherein the lead-frame body structure is a cathode, thereby producing said lead-frame structure which comprises at least two lead-frame entities each one having two faces and at least partially exposing said treated silver surface,
characterized in that said at least one of said two faces of at least one of said at least two lead-frame entities either exclusively exposes said treated silver surface or
that said at least one of said two faces of said at least one of said at least two lead-frame entities partially exposes said treated silver surface and partially exposes said copper surface, wherein, on each one of said two faces of each one of said at least two lead-frame entities which partially exposes said treated silver surface, the area of said copper surface is smaller than the area of said treated silver surface.

2. A method of producing a surface mount electronic device, said method comprising the following method steps carried out in this order:
   (a) providing a lead-frame body structure having two main sides, said lead-frame body structure exclusively exposing a copper surface on each one of said main sides;
   (b) depositing a silver coating on at least one of said main sides, so that said at least one of said main sides at least partially exposes an untreated silver surface;
   (c) electrolytically treating said untreated silver surface on said at least one of said main sides generated in method step (b) with a treatment solution containing at least one hydroxide compound selected from alkali metal hydroxides, alkaline earth metal hydroxides, ammonium hydroxides and mixtures thereof, wherein the lead-frame body structure is a cathode, thereby producing a lead-frame structure which comprises at least two lead-frame entities each one having two faces and at least partially exposing said treated silver surface;
   (d) mounting at least one semiconductor device on at least one of said at least two lead-frame entities, and bonding said at least one semiconductor device to said treated silver surface, wherein said bond is capable of creating an electrical connection between said at least one of said at least two lead-frame entities and said at least one semiconductor device;
   (e) encapsulating said at least one of said at least two lead-frame entities together with said at least one semiconductor device using a resin material, thereby forming at least one surface mount electronic device structure; and
   (f) singularizing said surface mount electronic device from said surface mount electronic device structure,
characterized in that said at least one of said two faces of at least one of said at least two lead-frame entities either exclusively exposes said treated silver surface or
that said at least one of said two faces of said at least one of said at least two lead-frame entities partially exposes said treated silver surface and partially exposes said copper surface, wherein, on each one of said two faces of each one of said at least two lead-frame entities which partially exposes said treated silver surface, the area of said copper surface is smaller than the area of said treated silver surface.

3. The method according to claim 1, wherein said at least one of said two faces of at least one of said at least two lead-frame entities exclusively exposes said treated silver surface and no copper surface.

4. The method according to claim 1, wherein said silver coating is at most 2 µm thick.

5. The method according to claim 1, wherein said treatment solution additionally contains at least one silicate salt.

6. A method of producing a lead-frame having two faces and exposing a treated silver surface on at least one of said two faces, said method comprising the following method steps carried out in this order:
  (a) providing a lead-frame body having two main sides, said lead-frame body exclusively exposing a copper surface on each one of said main sides;
  (b) depositing a silver coating on at least one of said main sides, so that said at least one of said main sides at least partially exposes an untreated silver surface; and
  (c) electrolytically treating said untreated silver surface on said at least one of said main sides generated in method step (b) with a treatment solution containing at least one hydroxide compound selected from alkali metal hydroxides, alkaline earth metal hydroxides, ammonium hydroxides and mixtures thereof, wherein the lead-frame body is a cathode, thereby producing said lead-frame, characterized in that said at least one of said two faces of said lead-frame either exclusively exposes said treated silver surface or that said at least one of said two faces of said lead-frame partially exposes said treated silver surface and partially exposes said copper surface, wherein, on each one of said two faces of said lead-frame, the area of said copper surface is smaller than the area of said treated silver surface.

7. Method for producing a lead-frame structure having two faces and exposing a treated silver surface on at least one of said two faces, wherein said lead-frame structure comprises at least two lead-frame entities each one having two faces, said method comprising:

providing a lead-frame body structure which has two main sides with an untreated silver surface exposed on at least one of said two main sides; and
  electrolytically treating a lead-frame body structure which has two main sides and which is provided with an untreated silver surface on at least one of said main sides with a treatment solution, wherein said lead-frame body structure is a cathode, wherein the treatment solution contains at least one hydroxide compound selected from alkali metal hydroxides, alkaline earth metal hydroxides, ammonium hydroxides and mixtures thereof, thereby producing said lead-frame structure, characterized in that said at least one of said two faces of at least one of said at least two lead-frame entities exclusively exposes said treated silver surface or that said at least one of said two faces of said at least one of said at least two lead-frame entities partially exposes said treated silver surface and partially exposes a copper surface, wherein, on each one of said two faces of each one of said at least two lead-frame entities which partially exposes said treated silver surface, the area of said copper surface is smaller than the area of said treated silver surface.

8. The method according to claim 2, wherein said at least one of said two faces of at least one of said at least two lead-frame entities exclusively exposes said treated silver surface and no copper surface.

9. The method according to claim 2, wherein said silver coating is at most 2 μm thick.

10. The method according to claim 2, wherein said treatment solution additionally contains at least one silicate salt.

* * * * *